US006796843B1

(12) United States Patent
Ryan et al.

(10) Patent No.: US 6,796,843 B1
(45) Date of Patent: Sep. 28, 2004

(54) CONNECTOR ASSEMBLY INCLUDING LEGACY AND EXTENSION PARTS THAT MAINTAINS BACKWARD COMPATIBILITY

(75) Inventors: Sean Ryan, Wake Forrest, NC (US); Robert Loose, Morrisville, NC (US); Phong Ho, Cary, NC (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 10/227,472

(22) Filed: Aug. 23, 2002

(51) Int. Cl.[7] ........................ H01R 25/00; H01R 27/02; H01R 31/00; H01R 12/00; H05K 1/00

(52) U.S. Cl. .......................................... 439/638; 439/59

(58) Field of Search ................................. 439/638, 639, 439/640, 59, 79; 361/737

(56) References Cited

U.S. PATENT DOCUMENTS

| | | | | | |
|---|---|---|---|---|---|
| 4,677,527 | A | * | 6/1987 | Pasterchick et al. | 361/737 |
| 5,184,961 | A | * | 2/1993 | Ramirez et al. | 439/59 |
| 5,492,481 | A | * | 2/1996 | Lewis | 439/159 |
| 5,509,826 | A | | 4/1996 | White | |
| 5,549,480 | A | * | 8/1996 | Cheng | 439/79 |
| 5,816,827 | A | | 10/1998 | Nelson et al. | |
| 6,068,500 | A | | 5/2000 | Kantner | |

FOREIGN PATENT DOCUMENTS

| | | | |
|---|---|---|---|
| EP | 0 450 447 A1 * | 10/1991 | H01R/23/70 |

OTHER PUBLICATIONS

Statement of Relevance: Typical rear view of a PC hard drive (connector end) depicting individual connectors that are mounted to a printed circuit board. The connections are made via discrete connectors attached to different cable assemblies. Attached illustration downloaded from Seagate website: <URL:http://www.seagate.com>.

* cited by examiner

*Primary Examiner*—Chandrika Prasad
(74) *Attorney, Agent, or Firm*—Charles E. Krueger

(57) ABSTRACT

A card-receiving connector includes a legacy connector part and an additional connector part that facilitates plugging in cards having improved functionality while also allowing legacy cards to be plugged in. In one embodiment, the legacy part includes signal, power, and supply contacts required by a legacy card and includes power and supply contacts required by an improved card in an extension part. A legacy card can be connected to the legacy part without interference from the extension part to facilitate backward compatibility with the legacy card.

10 Claims, 5 Drawing Sheets

CONNECTOR ASSEMBLY INCLUDING LEGACY AND EXTENSION PARTS THAT MAINTAINS BACKWARD COMPATIBILITY

BACKGROUND OF THE INVENTION

Incompatibility between new and existing products is a major problem in many technical disciplines including networking and signal switching. Often new products are developed having increased performance and speed but customers have invested heavily in legacy products.

Incompatibility is a particular problem with routing-platforms. Generally a router includes a chassis which can be rack mounted and has slots which ports and modules slide into, and which contains basic components such as power supply(s) and fan(s). The modules inserted into the slots are line cards which are the actual printed circuit boards that handle packet data and analog signaling ingress and egress. Line cards provide one or more interfaces over which traffic flows. Thus, depending on the number of slots and interfaces, a router can be configured to work with a variety of networking protocols.

A major concern of customers is to maximize the performance of a given chassis or line card to reduce the needed amount of costly rack space.

One example of a rapidly changing router product is the WIC (WAN Interface Card) where a WAN (Wide Area Network) is a data communications network that serves users across a broad geographic area and often uses transmission devices provided by common carriers. A WIC connects the routing-platform to the WAN link service provider.

Many customers are using WICs designed several years ago which originally targeted PHY devices with a maximum bit rate of up to a few Mbps. Since then, the explosion of the internet and broadband availability has enormously increased the speed and complexity required of routing-platform interfaces. The increased performance required for newly designed WICs requires form factors, pin-outs, and connectors that are different from the legacy cards.

Thus, there is continuing demand to design new cards with higher performance, which often results in different form factors and signal pin-outs, which conflicts with the customers desire to utilize cards and card interfaces already in service.

BRIEF SUMMARY OF THE INVENTION

According to one embodiment of the invention, connectors for a WAN Interface Card Interface (WIC) provide for the development of WAN Interface Cards that can be used across different platforms. The ability to leverage one design in many platforms greatly reduces the development overhead by leveraging one design in many platforms and the number of Modules for homologation, compliance, and safety testing.

According to another embodiment of the invention, a connector assembly includes a card-receiving connector that has first and second parts. The first part is a connector that is compatible with a legacy card-side connector and the second part has contacts for supplying additional power and supply to an improved card. The first and second parts of the card-receiving connector are configured so that a legacy card can be plugged in to the first part without interference from the second part so that the card-receiving connector is compatible with both legacy and improved cards.

According to another embodiment of the invention, the second part of card-receiving connector is disposed over the first part so that the card-side connector is the same width as a legacy connector to facilitate side by side positioning of cards to effectively reduce the amount of costly rack space.

According to another aspect of the invention, a card-side connector includes a first part being a legacy connector and a second part in the form of a card-edge connector for connecting to the second part of the card-receiving connector and providing additional supply and return to an improved card. The use of a card edge connector removes one set of tolerances.

Other features and advantages of the invention will be apparent in view of the following detailed description and appended drawings.

DETAILED DESCRIPTION OF THE INVENTION

Figure 1:
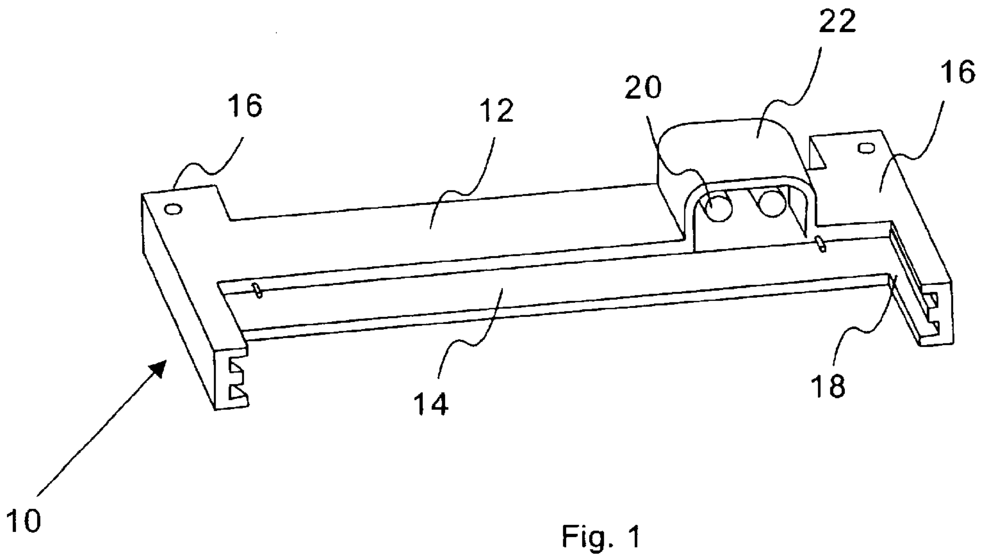
FIG. 1 is a perspective view of a backplane connector assembly having supply and return pins in a third row post.

The invention will now be described, by way of example, not limitation, with reference to various embodiments. In a particular, an embodiment of the invention will be described in the context of a WIC. However, it will be understood by persons of ordinary skill in the art that the invention has broad utility in other areas of technology as will be apparent from the following description.

As described above, the increased speed and complexity of routing-platform interfaces requires that cards be designed with larger footprints and/or that can utilize additional supplies so that the card can perform more functions and dissipate more power. However, such a card requires a different connector with additional pins for supplying increased amount of power while at the same time being able to connect to legacy cards.

In the following, the high-performance WIC (HWIC) will be referred to as the double-wide (DW) HWIC card or single-wide (SW) HWIC and the legacy card will be referred to as the single-wide (SW) WIC card. The HWIC may provide:

- Increased Real Estate. The legacy SW–WIC form factor is so small that it limits the board space allowed for implementing solutions. DW–HWIC will allow more available board space if required for implementing larger, more complex modular solutions.
- More Power. The legacy SW–WIC power is limited by the WIC specification as well as by the physical connector. This unduly limits the design of modular interface cards. Both the SW–HWIC and the DW–HWIC allow more power for larger, more complex or power hungry applications.
- Additional power dissipation. A DW–HWIC occupies twice the physical space of a SW–WIC, and is thus allowed to dissipate twice the amount of power.
- Additional supply current. Both the SW–HWIC and the DW–HWIC have access to an additional Aux Power supply. This allows for each supply to provide substantially more current to either the SW–HWIC or DW–HWIC. The Aux Power connector offers more voltages (−48V and +3.3V) that are not available on the SW–WIC.

The embodiments of the invention described below are connector assemblies that enhance functionality of existing VIC (Voice Interface Card) or WVIC (WIC and VIC) slots. This allows higher functional density while continuing to provide legacy support for WVIC and VIC slots. The legacy WVIC, and VIC slots, will be replaced with WVIC+HWIC, and VIC+HWIC slots respectively. In each embodiment the extra contacts provided may be utilized to provide additional supply and return, additional signal levels, or some combination thereof.

The connector assembly includes a card-receiving connector into which the card-side connector is inserted. The card-receiving connector may be a backplane connector mounted on a backplane oriented perpendicular to the card or a right angle connector mounted on a PCB oriented parallel to the card. In the embodiments depicted in the Figures the card-receiving connectors are depicted as backplane connectors. However, persons of skill in the art will understand that right angle connectors can also be utilized with the invention.

Referring now to the drawings, where like or similar parts are designated by the same reference number, a first embodiment of the invention is depicted in FIG. 1. In this embodiment the SW–WIC utilizes a 68 pin PCMCIA-type connector. The PCMCIA-type connector includes two rows of pins located in the male connector slot of a housing.

The backplane connector assembly 10 includes a housing 12 having a horizontal slot 14 holding the PCMCIA-type connector. The housing 12 also includes end sections 16 with guiding slots 18 for guiding a card being plugged in to the backplane connector 10.

In this embodiment, the additional supply and return pins are located above the PCMCIA-type connector as a third row post 20. These pins function as the 48V in-line supply and return and can also assist to guide a card into the connector. The housing 12 includes a third row section 22 that encloses the pins in the third row.

Figure 2:
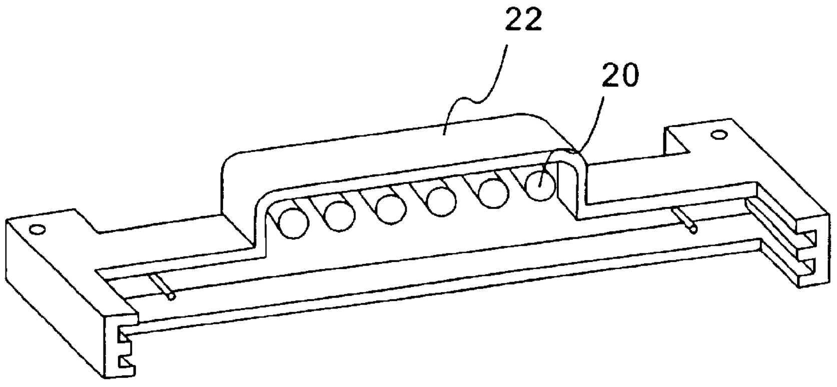
FIG. 2 is a perspective view of a backplane connector assembly having additional supply and return pins in a third row post.

FIG. 2 depicts a second embodiment of the third row post connector having extra pins in the third row post 20 to function as multi-voltage supply and return.

Figure 3:
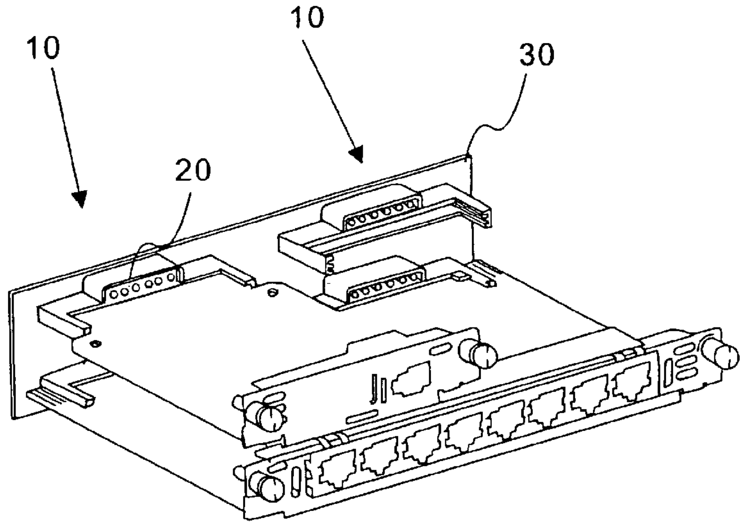
FIG. 3 depicts connector assemblies connected to a backplane to facilitate side-by-side or over-under placement of SW–WICs.

This configuration is especially advantageous when it is desired to insert two SW–WICs side-by-side into the same slot As depicted in FIG. 3, the connectors can be mounted side by side on the backplane 30 because the extra power pins in the third row post 20 do not consume any lateral real estate on the midplane.

FIG. 3 depicts a single SW–WIC positioned in the left side of the slot thereby allowing a second SW–WIC to be positioned in the left side. Alternatively, a single DW–WIC, such as the 8-port RJ45 connector can be inserted in the slot. As depicted in FIG. 3, the third row connectors are double stacked to allow more efficient use of the 1 RU form factor.

Figure 4:
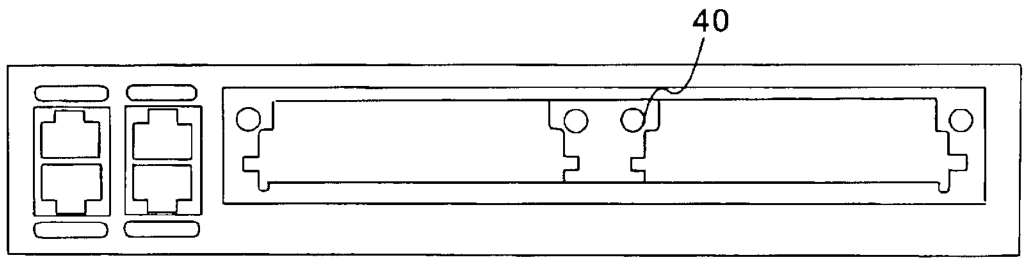
FIG. 4 depicts a slot with a removable center post to facilitate side-by-side placement of SW–WICs.

FIG. 4 depicts a removable center guide 40 that allows the same slot to be utilized for a single DW–WIC or two SW–WICs. The connectors are arranged on the mid-plane as depicted in FIG. 3.

The next several embodiments to be described utilize edge connectors in combination with the legacy connector to provide either power and/or signals to provide extra functionality to the HWICs while retaining backward compatibility with SW–WICs. The use of card edge connectors instead of pins eliminates one set of placement tolerances.

Figure 5:
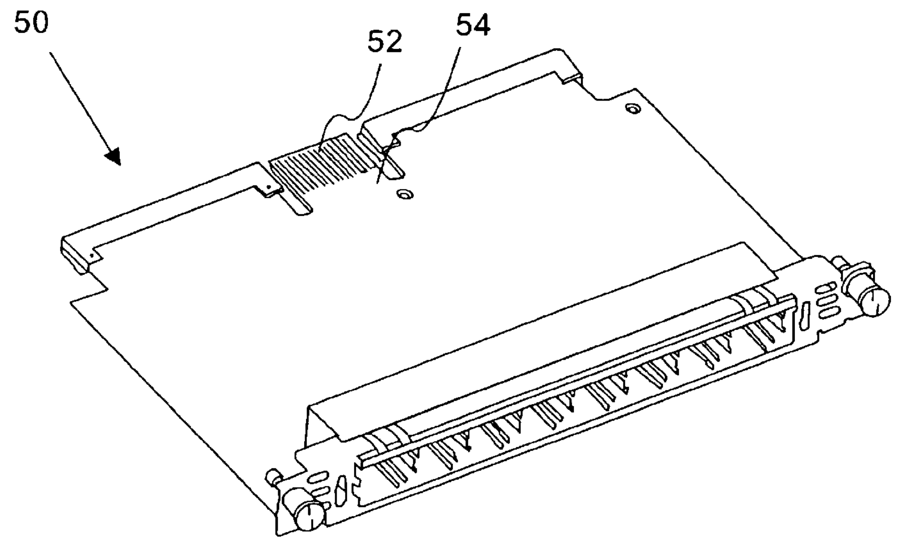
FIG. 5 is a perspective view of a card having an edge connector disposed on a center section.

FIG. 5 depicts a DW–WIC with a legacy plug-in connector 50 at one side and a card edge connector 52 formed on a middle section 54. The card edge connector area on the middle section 54 includes metal tabs for receiving supply and return and (optionally) additional signal levels. The backplane card edge connector (not shown) includes a slot for receiving the card edge connector area and contacts for engaging the metal tabs on the card edge connector area and for forming an electrical connection with them in addition to the connector for receiving the legacy card-side connector.

Figure 6:
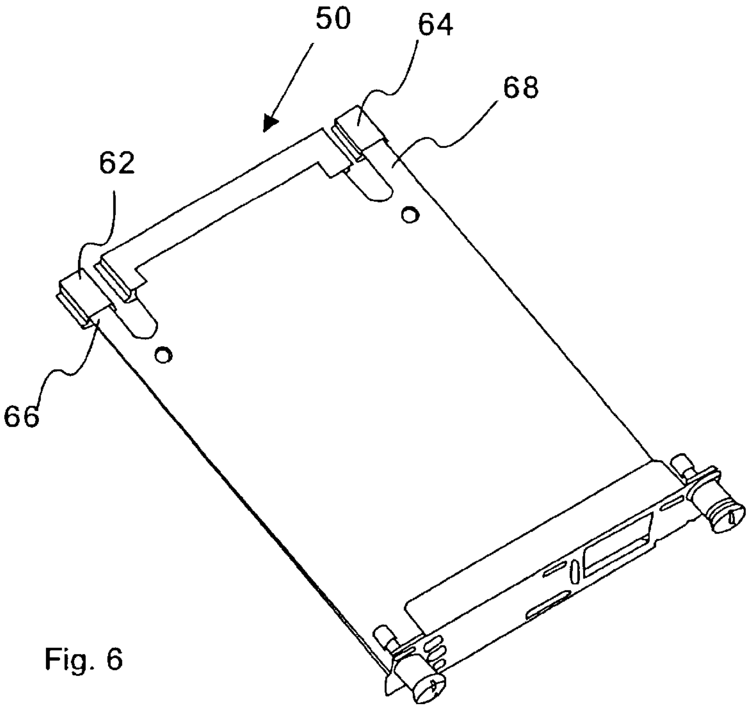
FIG. 6 is a perspective view of a card having edge connectors disposed on edge sections.

FIG. 6 depicts a SW–WIC with a legacy plug-in connector 50 at the center of the card and first and second card edge connector 62 and 64 formed on first and second card sections 66 and 68 disposed on either side of the plug-in connector. The card edge connector area on the section includes metal tabs for receiving supply and return. The backplane card edge connector (not shown) includes first and second slots for receiving the first and second card edge connector areas and each slot includes contacts for engaging the metal tabs on the card edge connector area and for forming an electrical connection with them.

Figure 7:
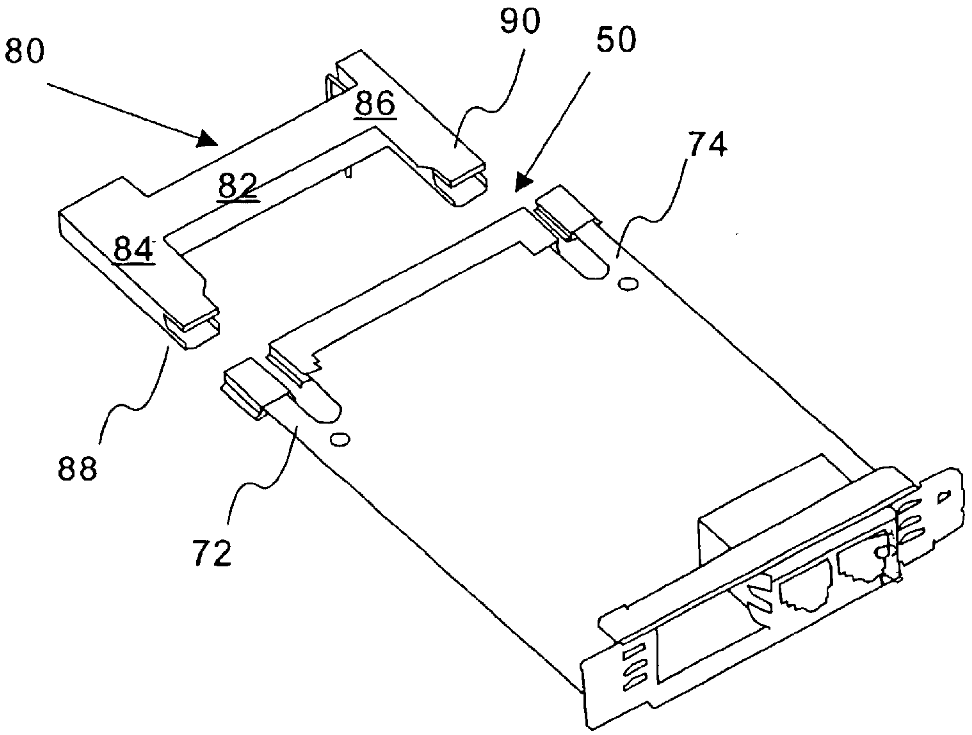
FIG. 7 is a perspective view of a card having an edge connectors disposed on edge sections and a backplane connector having end sections with slots for receiving the edge sections.

FIG. 7 depicts a SW–WIC with a legacy plug-in connector 50 at the center of the card and first and second card edge connector formed on first and second card sections 72 and 74 disposed on either side of the plug-in connector 50 and recessed from the back of the card. The card edge connector area on the section includes metal tabs for receiving in-line supply and return. The backplane connector 80 includes a center section 82 for engaging the legacy plug-in connector and first and second end sections 84 and 86 for guiding the card to engage the plug-in connector slot. Each of the first and second end sections 84 and 86 includes a slot 88 and 90, respectively, for receiving the corresponding card edge connector area and each slot includes contacts for engaging the metal tabs on the card edge connector area and for forming an electrical connection with them.

The next several embodiments to be described include extra pins for supply and return displaced laterally from the legacy connector.

Figure 8:
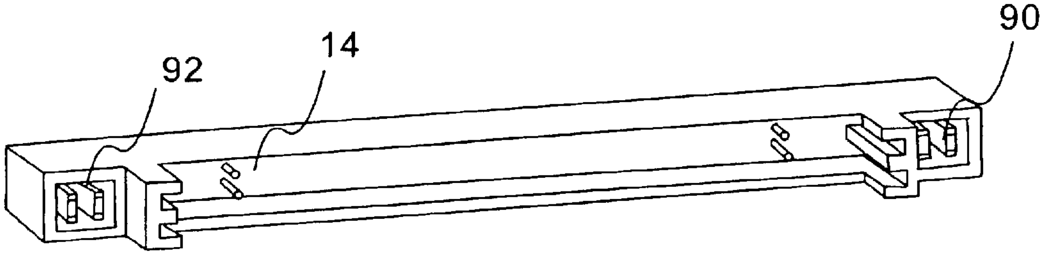
FIG. 8 is a perspective view of a backplane connector having a center slot and additional pins disposed on either side of the center slot for providing supply and return.
Figure 9:
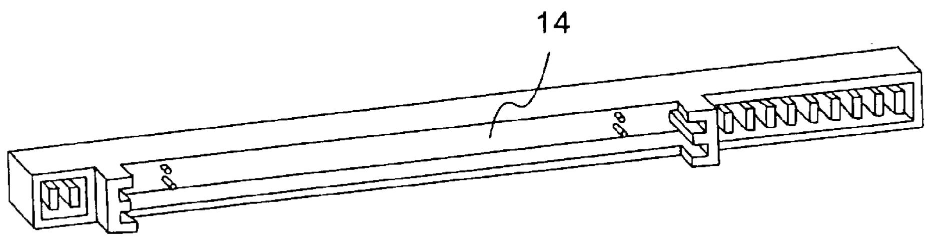
FIG. 9 is a perspective view of a backplane connector as in FIG. 8 with additional supply and return pins disposed on one side.

FIGS. 8 and 9 depict backplane connectors having power and return blades displaced laterally from the legacy backplane connector. In FIG. 8, four blades are utilized to supply increased current ratings at various voltage ratings. A first pair of blades 90 are disposed to the right of the plug-in connector slot 14 and a second pair of blades 92 are disposed to the left of the connector slot 14. This backplane connector is compatible with a SW–WIC which plugs into the center legacy connector and a SW–HWIC which plugs into the center signal connector and also connects to the extra power blades.

In FIG. 9 the connector is changed to have additional blades disposed on one side (in this case the right side) of the signal connector 14. Thus, a DW-HWIC that requires extra power can be plugged in while compatibility with legacy SW-WICs and SW-HWICs is maintained.

Figure 10:
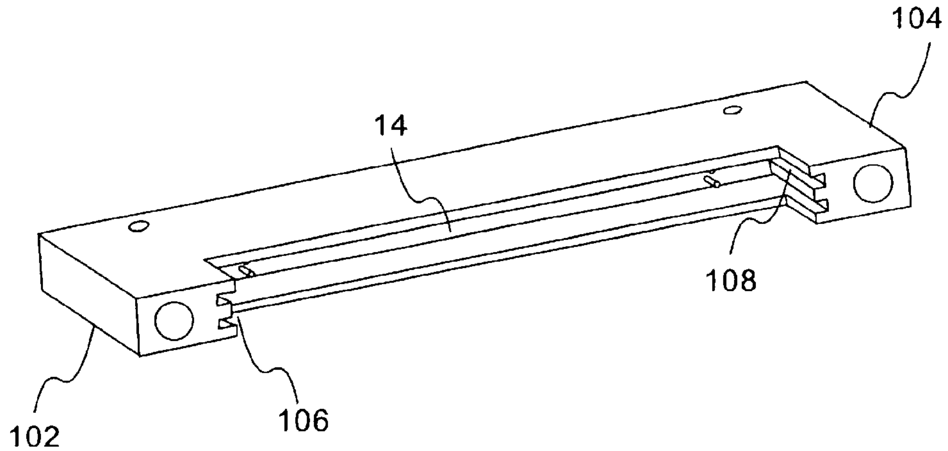
FIG. 10 is a perspective view of a backplane connector having a center slot and end sections which use power pins as guide features.

An alternative embodiment is depicted in FIG. 10, which is a backplane connector having a center plug-in connector slot 14 and end sections 102 and 104 including slots 106 and 108, respectively, for guiding the card in the center connector slot 14. Each end section includes power pins for supply and return for the SW-HWIC.

Accordingly, various embodiments of a card connector system which facilitates the use of new technology while allowing customers to utilize previously purchased legacy cards has been described. Alternatives and substitutions will now be apparent to persons of skill in the art. For example, the number of supply and return pins may vary from those described due to different current ratings of parts utilized. Further, the invention is not limited to a WIC but is useful in other interfaces utilizing cards that have been upgraded. Additionally, the Figures depict specific types of contacts such as pins or tabs by way of example. However, as understood by persons of ordinary skill in the art the particular form of the contacts is not critical to practicing the invention any type of contacts such as clips, slots, etc. may be utilized. Further, the legacy signal connector need not be a 68-pin PCMCIA-type connector but comprise other connector configurations known in the art. Accordingly, it is not intended to limit the invention except as provided by the appended claims.

What is claimed is:

1. A card receiving connector assembly comprising:

a legacy connector part compatible with a card connector of a legacy card; and an extension part including contacts for providing additional supply and return contacts for an improved card, with the extension part disposed relative to the legacy connector part so that a connector on the legacy card can be plugged in to the legacy connector part without interference from the extension part and so that a connector on the improved card can be plugged in to both the signal connector part and the extension part to receive extra power supplied from the extension part.

2. The connector assembly of claim 1 where:

the extension part comprises a row of posts disposed above the legacy connector part so that extra supply and return contacts can be provided to the improved card without consuming lateral space on a backplane.

3. The connector assembly of claim 1 where:

the extension part comprises a slot for engaging a card edge connector on the improved card to reduce required tolerances.

4. The connector assembly of claim 1 where:

the extension part includes extra pins disposed laterally from the legacy connector part.

5. The connector assembly of claim 1 wherein extension part includes contacts for providing additional signal levels.

6. A connector assembly comprising:

a card-receiving connector having a first part being a legacy connector configured to receive a legacy card-side connector and having a second part, disposed above the first part, configured to have contacts for providing additional supply and return to an improved card;

the card-side connector having the first part being the legacy card-side connector and a second part, disposed over the first part, having contacts for contacting the contacts of the second part of the card-receiving connector to provide additional supply and return to an improved card;

with the first and second parts of the card-receiving connector configured so that the legacy card-side connector can be connected to the first part of the card-receiving connector without interference from the second part of the card-receiving connector.

7. A connector assembly comprising:

a card-receiving connector having a first part being a legacy connector configured to receive a legacy card-side connector and having second part, disposed laterally from the first part, configured to have contacts for providing additional supply and return to an improved card and for receiving a card-edge connector;

the card-side connector having the first part being the legacy card-side connector and a second part, disposed laterally the first part, configured as a card-edge connector having contacts for contacting the contacts of the second part of the card-receiving connector to provide additional supply and return to an improved card;

with the first and second parts of the card-receiving connector configured so that the legacy card-side connector can be connected to the first part of the card-receiving connector without interference from the second part of the card-receiving connector.

8. The connector assembly of claim 7 where the second part of the card-side connector comprises:

first and second card edge connectors disposed on either side of the first part of the card-side connector.

9. The connector assembly of claim 8 where said first and second card edge connectors are recessed relative to the first part of the card-side connector and where the second part of the card-receiving connector includes first and second end sections extending outward from the first part of the card-receiving connector and including guiding slots.

10. A connector assembly comprising:

a card-receiving connector having a first part being a legacy connector configured to receive a legacy card-side connector and having a second part, disposed laterally from the first part, configured to have contacts for providing additional supply and return to an improved card;

the card-side connector having the first part being the legacy card-side connector and a second part, disposed laterally from the first part, having contacts for contacting the contacts of the second part of the card-receiving connector to provide additional supply and return to an improved card;

with the first and second parts of the card-receiving connector configured so that the legacy card-side connector can be connected to the first part of the card-receiving connector without interference from the second part of the card-receiving connector.

* * * * *